(12) United States Patent
Wimpenny

(10) Patent No.: US 8,093,945 B2
(45) Date of Patent: Jan. 10, 2012

(54) JOINT OPTIMISATION OF SUPPLY AND BIAS MODULATION

(75) Inventor: Gerard Wimpenny, Cambridge (GB)

(73) Assignee: Nujira Limited, Cambridge (GB)

( * ) Notice: Subject to any disclaimer, the term of this patent is extended or adjusted under 35 U.S.C. 154(b) by 282 days.

(21) Appl. No.: 12/293,315

(22) PCT Filed: Mar. 19, 2007

(86) PCT No.: PCT/GB2007/000959
§ 371 (c)(1),
(2), (4) Date: Apr. 8, 2009

(87) PCT Pub. No.: WO2007/107728
PCT Pub. Date: Sep. 27, 2007

(65) Prior Publication Data
US 2009/0302941 A1    Dec. 10, 2009

(30) Foreign Application Priority Data
Mar. 17, 2006   (GB) .................................. 0605472.0

(51) Int. Cl.
   *H03G 3/20*   (2006.01)
(52) U.S. Cl. ........................................ 330/129; 330/285
(58) Field of Classification Search .................. 330/285, 330/129, 136, 296
   See application file for complete search history.

(56) References Cited

U.S. PATENT DOCUMENTS

| | | | |
|---|---|---|---|
| 3,443,241 A * | 5/1969 | Pitzalis, Jr. .................... | 330/285 |
| 6,157,253 A | 12/2000 | Sigmon et al. | |
| 6,327,462 B1 | 12/2001 | Loke et al. | |
| 6,853,243 B2 * | 2/2005 | Sekine et al. ................... | 330/51 |
| 7,103,114 B1 * | 9/2006 | Lapierre ....................... | 375/318 |

OTHER PUBLICATIONS

Forestier S et al, "Joint optimization of the power-added efficiency and the error-vector measurement of 20-GHZ PHEMT amplifier through a new dynamic bias-control method", IEEE transactions on microwave theory and techniques, IEEE service center, vol. 52, No. 4, Apr. 2004, pp. 1132-1141, XP001192729, Piscataway NJ, US, ISSN: 0018-9480.

Kounghoom Yang et al, "High-efficiency class-A power amplifiers with a dual-bias-control scheme", IEEE transactions on microwave theory and techniques, IEEE service center, vol. 47, No. 8, Aug. 1999, Piscataway, NJ, US, XP011037698, ISSN: 0018-9480.

Patent Cooperation Treaty, "International Search Report and Written Opinion", International Searching Authority, dated Jun. 25, 2007.

* cited by examiner

*Primary Examiner* — Henry Choe
(74) *Attorney, Agent, or Firm* — DeMont & Breyer, LLC

(57) ABSTRACT

A radio frequency amplifier system is disclosed in which the amplifier bias supply and power supply voltages are instantaneously modulated with signals derived from the envelope voltage of the input signal. Separate non-linear mapping functions are used to derive the supply and bias voltages. The two mapping functions are optimised jointly to achieve particular system performance goals, such as optimum efficiency, constant gain, constant phase, or minimum spectral spreading. An optimisation of particular interest is that which achieves best RF amplifier power added efficiency subject to achieving constant amplifier gain. In this way the need for pre-distortion linearization may be reduced or eliminated.

14 Claims, 13 Drawing Sheets

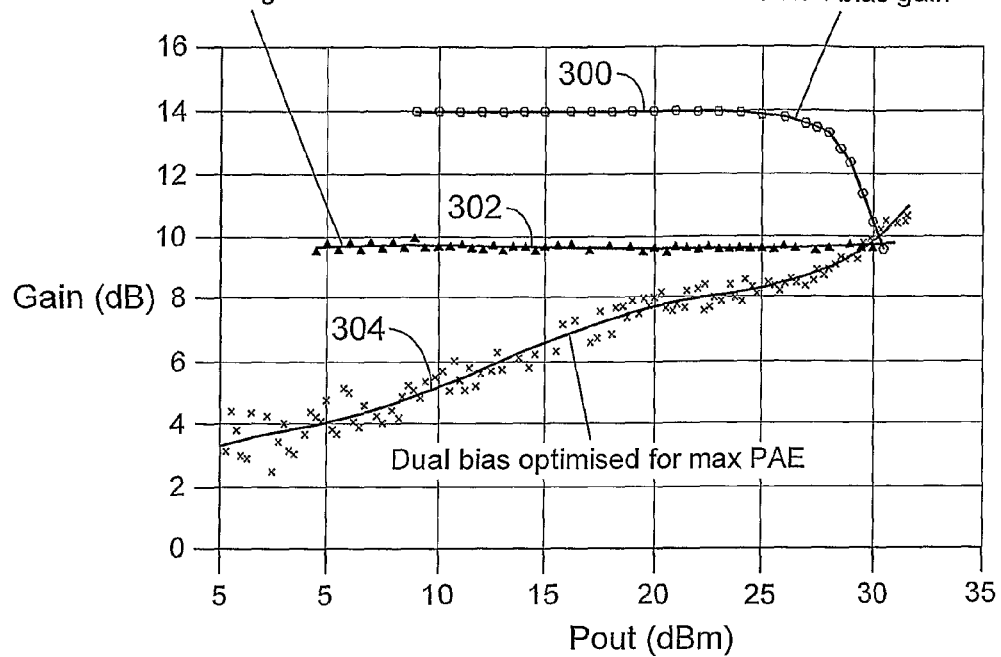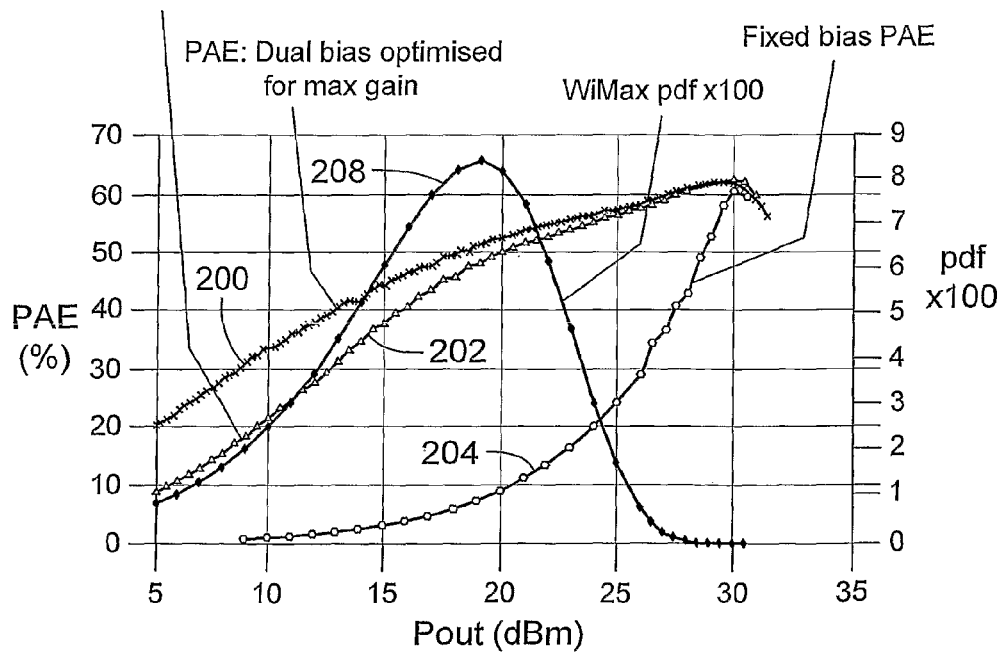

| 802.11a avg Pwr (dBm) | Efficiency (%) | | |
|---|---|---|---|
| | Fixed Bias | Opt PAE | 10dB Const gain |
| 3.0 | 0.9 | 14.1 | 10.9 |
| 5.0 | 1.0 | 17.7 | 13.0 |
| 7.0 | 1.2 | 21.7 | 15.7 |
| 9.0 | 1.4 | 25.9 | 19.1 |
| 11.0 | 1.8 | 30.2 | 23.1 |
| 13.0 | 2.4 | 34.5 | 27.5 |
| 15.0 | 3.3 | 38.5 | 32.0 |
| 17.0 | 4.8 | 42.3 | 36.4 |
| 19.0 | 7.4 | 45.7 | 40.5 |
| 21.0 | 11.8 | 48.8 | 44.2 |

Fig. 10   ET Amplifier Gain sweeps for 10dB Gain ET datapoints

Fig.11 ET Amplifier Phase sweeps for 10dB Gain ET datapoints

JOINT OPTIMISATION OF SUPPLY AND BIAS MODULATION

FIELD OF THE INVENTION

The invention relates to techniques for achieving amplification of non-constant envelope signals. The invention particularly, but not exclusively, relates to the amplification of radio frequency (RF) signals.

DESCRIPTION OF THE RELATED ART

Many modern communication systems typically use non-constant envelope modulation techniques to achieve high spectral efficiency. To avoid spectral spreading into adjacent communication channels, high linearity radio frequency (RF) amplification is required. Traditional fixed bias amplifiers can only achieve the required linearity by 'backing off' the amplifier so that it normally operates at a power well below its peak power capability. Unfortunately, the DC to RF power conversion efficiency in this region is very low. As a consequence these designs dissipate considerable heat and reduce battery life when used in portable applications.

Maximisation of battery life is of paramount importance in mobile wireless equipment. With most high spectral efficiency communication standards, the mobile transmitter operates at considerably less than maximum power most of the time. There are two reasons for this. Firstly, power control is generally used to reduce the average transmit power to the minimum level required for reliable communication, and secondly, most emerging modulation schemes have a high peak-to-average power ratio. Hence it is important for the power amplifier to maintain high efficiency at powers significantly below maximum, where the power amplifier operates most of the time.

A well known prior art technique for increasing amplifier efficiency, known as "envelope tracking" (ET), uses a supply modulator to modulate the supply voltage substantially in line with the envelope of the input RF signal (Raab F. H., "Efficiency of envelope tracking RF power amplifier systems" Proc. of RF Expo East, Boston, USA November 1986, pp. 303-311). Classically, a voltage margin is added to the dynamic supply voltage to ensure that the power amplifier always operates in linear mode. To achieve highest overall efficiency, the efficiency of the supply modulator itself must be high, requiring the use of a switched mode DC-DC converter for the modulator. The design of the supply modulator is critical to the system performance of the amplifier. In addition to achieving good efficiency, the modulator must also exhibit high bandwidth, high linearity and low noise to be useful in modern communications applications which typically use high bandwidth CDMA or OFDM modulation schemes and also demand high modulation accuracy.

One prior art technique for the supply modulator design (commonly referred to as a class-S arrangement) uses switch mode pulse width modulation (U.S. Pat. No. 6,141,541, U.S. Pat. No. 6,025,754). Although practical for low modulation bandwidths, in such class-S arrangements switching losses become unacceptable at the rates required for modern modulation formats.

Another prior art technique for a supply modulator design (commonly referred to as a class-G arrangement) uses multiple voltage sources and dynamically switches the amplifier supply terminal between the sources dependant on the instantaneous envelope level (WO 0118956, U.S. Pat. No. 5,115,203). However, a drawback is that the instantaneous switching creates noise and intermodulation distortion (IMD) products in the RF output which are difficult to remove. A modification to this technique uses linear interpolation between the switching levels to greatly reduce the noise and IMD products (WO 2004/075398).

Another well known prior art technique for increasing amplifier efficiency is to dynamically modulate the RF amplifier bias substantially in line with the envelope of the modulating signal (U.S. Pat. No. 4,462,004). Although some improvement in efficiency can be obtained by using dynamic biasing, this is significantly less than can be achieved by supply modulation. It has also been proposed that dynamic amplifier bias modulation may be used in conjunction with supply modulation to improve efficiency (WO 03056698).

Other techniques can also be used to improve efficiency. Envelope Elimination and Restoration (EER) uses a limiter to remove all amplitude modulation (AM) on the RF input signal, and then re-applies the AM using supply modulation of the RF amplifier (WO 9905783). This technique offers good power added efficiency (PAE) improvement at high signal levels, but relatively poor PAE at lower signal levels due to a high input drive level. It also suffers from several significant implementation problems including capacitive leakage from input to output at low signal levels, which degrades modulation accuracy, and the need for the supply modulator bandwidth to be significantly greater than the envelope bandwidth.

Alternatively, the amplifier device periphery can be altered to improve efficiency (U.S. Pat. No. 6,445,247). Although such a technique may be effective as a means of tracking slowly varying changes in average power, it is less effective as a means of enhancing efficiency with signals having high Peak-to-Average Power (PAP), such as OFDM signals. This is because of the problem of achieving smooth transitions in device periphery, without which noise and IMD targets is difficult to solve.

In summary, from the known prior art arrangements, ET shows promise as a viable efficiency enhancement solution. However, a disadvantageous side effect of supply modulation is that if the supply voltage precisely tracks the envelope, or is optimised for best amplifier efficiency at each envelope level, the RF gain reduces at low input levels. The non-linearity so introduced results in the generation of unwanted IMD products. Various techniques have been proposed in the prior art to ameliorate these effects. These include pre-distortion of the RF input (WO 02058249), and the use of envelope feedback from the RF output (US 2003/0045238).

An alternative linearization approach is to use an envelope voltage to supply a voltage mapping function to achieve constant gain from the RF amplifier, thereby reducing the need for pre-distortion or feedback (WO 0118956). The mapping function between envelope voltage and supply voltage may use a continuous function, in which the envelope voltage may be uniquely derived from knowledge of the supply voltage, or use thresholding, whereby the supply voltage is held constant when the envelope falls below a prescribed level (U.S. Pat. No. 6,437,641).

Combinations of techniques may also be used. Dual bias (supply and gate/base) modulation schemes are described in WO 0118956, WO 0041296 and "High Efficiency Class-A Power Amplifiers with a Dual-Bias-Control Scheme", Kyounghoon Yang, George Haddad and Jack East, IEEE Transactions on Microwave Theory and Techniques, Vol. 47, No. 8, August 1999. These techniques offer efficiency improvements over the use of supply or bias modulation alone. The solution shown in WO 0041296 describes the use of dual bias in conjunction with pre-distortion linearization and feedback. The use of a pure class-G supply modulator in conjunction with bias modulation to achieve constant gain from an RF amplifier is described in WO 0118956. This solution does not address the noise and IMD problems introduced by the stepped supply voltage.

Although dual bias modulation offers attractive potential performance improvements, the scheme used to control the supply and bias voltages is critical to its success.

An RF amplifier may in general be considered as a 'black box' system with a number of input ports and a number of output ports. Usually the amplifier has one RF input port, one RF output port, and two bias input ports; the gate/base bias input port and the supply bias input port. From the discussion of the prior art it will be clear that two common system design objectives are to achieve high PAE and high amplifier linearity.

The aim of the invention is to provide a method and apparatus for controlling an amplifier to achieve prescribed performance objectives.

SUMMARY OF THE INVENTION

The invention provides for the derivation of dual control voltages to optimise amplifier system performance. Without the solution provided by the invention, the complex and interdependent nature of key amplifier performance parameters (particularly gain, phase, efficiency) with respect to both supply and bias inputs, limit the usefulness of a dual bias architecture.

It should be noted that for the purposes of the definition of the invention the terms supply and bias inputs are used, and for the purposes of the description of preferred arrangements of the invention the terms supply and bias voltages are used. In general a supply input may be a supply current or a supply voltage, and a bias input may be a bias current or a bias voltage. The described embodiments herein are in the context of supply and bias voltages.

In accordance with one aspect of the invention there is provided a method of controlling at least one amplification stage, comprising: selecting a specific system performance objective; and in dependence on an input signal to said amplification stage, selecting a supply input and a bias input for the amplification stage in order to meet said objective.

Preferably one of the supply input and the bias input is optimised, and the other is maximised.

The system performance objective is dual, meeting linearity and efficiency. In a preferred arrangement, a predefined request for linearity is met, and then subjected to a best efficiency. A best efficiency is thus achieved for a specified linearity. Preferably a certain value of linearity must be achieved, and then at least a certain objective of efficiency is achieved, and preferably maximised. Both these goals can be achieved with a joint optimisation of supply and bias in accordance with the invention.

The techniques described open up the possibility of using an amplifier to 'self linearise', thereby reducing or eliminating the need for pre-distortion. This is particularly attractive for mobile equipment, where increased complexity frequently carries a cost or power consumption penalty.

Low power RF amplifiers may be well described by a quasi-static, memory-less model described by the AM-AM (AM=amplitude modulation) and AM-PM (PM=phase modulation) performance of the amplifier. This is typically a complex function of a large number of amplifier parameters including device technology, device periphery, temperature, gate/base bias, supply voltage, input power and load impedance. Using automated measurement techniques it is possible to build a comprehensive map for the device of AM-AM, AM-PM and PAE performance with respect to key input parameters, including but not limited to gate/base bias, supply bias and input power. It is then possible to search a measurement database to determine optimum loci for gate/base bias and supply voltage to meet specific system performance goals. Hence the mapping function between input envelope and supply voltage, and between input envelope and bias voltage, to meet specific performance goals may be uniquely determined.

As an example, it may be desired to determine the optimum supply voltage and bias voltage locus to achieve best PAE for a wide range of output powers. Alternatively, it may be desired to determine the supply and bias loci giving best PAE subject to achieving a constant target gain over a wide range of output powers. Many other system performance targets could be specified, including best PAE subject to achieving constant phase with respect to output power.

It is also possible to formulate more sophisticated linearity targets involving both amplitude and phase and to combine these with efficiency constraints. Minimisation of ACPR is one such example and can be directly calculated from instantaneous measured AM-AM and AM-PM characteristics.

The described techniques for determining bias and supply voltage loci may also be used in conjunction with a variety of known feedback and feed-forward techniques to improve performance with respect to temperature fluctuations and unit-to-unit variations.

Software controlled automated equipment may be used to perform measurements on said amplifier. A software program may be used to assist searching of said measurement database or exploration of said model. The optimum bias voltage and the optimum supply voltage with respect to input power may be approximated by separate non-linear mapping functions. Said non-linear mapping functions may be updated in accordance with the temperature of said RF amplifier.

Pre-distortion of the RF waveform may be used to further optimise the system performance objectives of said RF amplifier.

Feedback from the output of said RF amplifier may be used to assist updating of said non-linear mapping functions. The non-linear supply mapping means and said non-linear bias mapping means may be updated in accordance with the temperature of said RF amplification stage. Pre-distortion of the RF waveform may be used to further optimise the system performance objectives of the RF amplification stage. Feedback from the Output of said RF amplifier may be used to assist updating of the non-linear supply mapping means and the non-linear bias mapping means.

BRIEF DESCRIPTION OF THE FIGURES

The description is accompanied by the following drawings:

FIGS. 6 and 7 represent the measured performance of an example amplification device controlled to operate in accordance with embodiments of the invention;

DESCRIPTION OF THE PREFERRED EMBODIMENTS

The invention is described herein by way of reference to particular preferred embodiments. The invention, and embodiments thereof, is particularly advantageously suited to cost, space and power constrained mobile applications, but is not exclusively applicable thereto.

Figure 1:
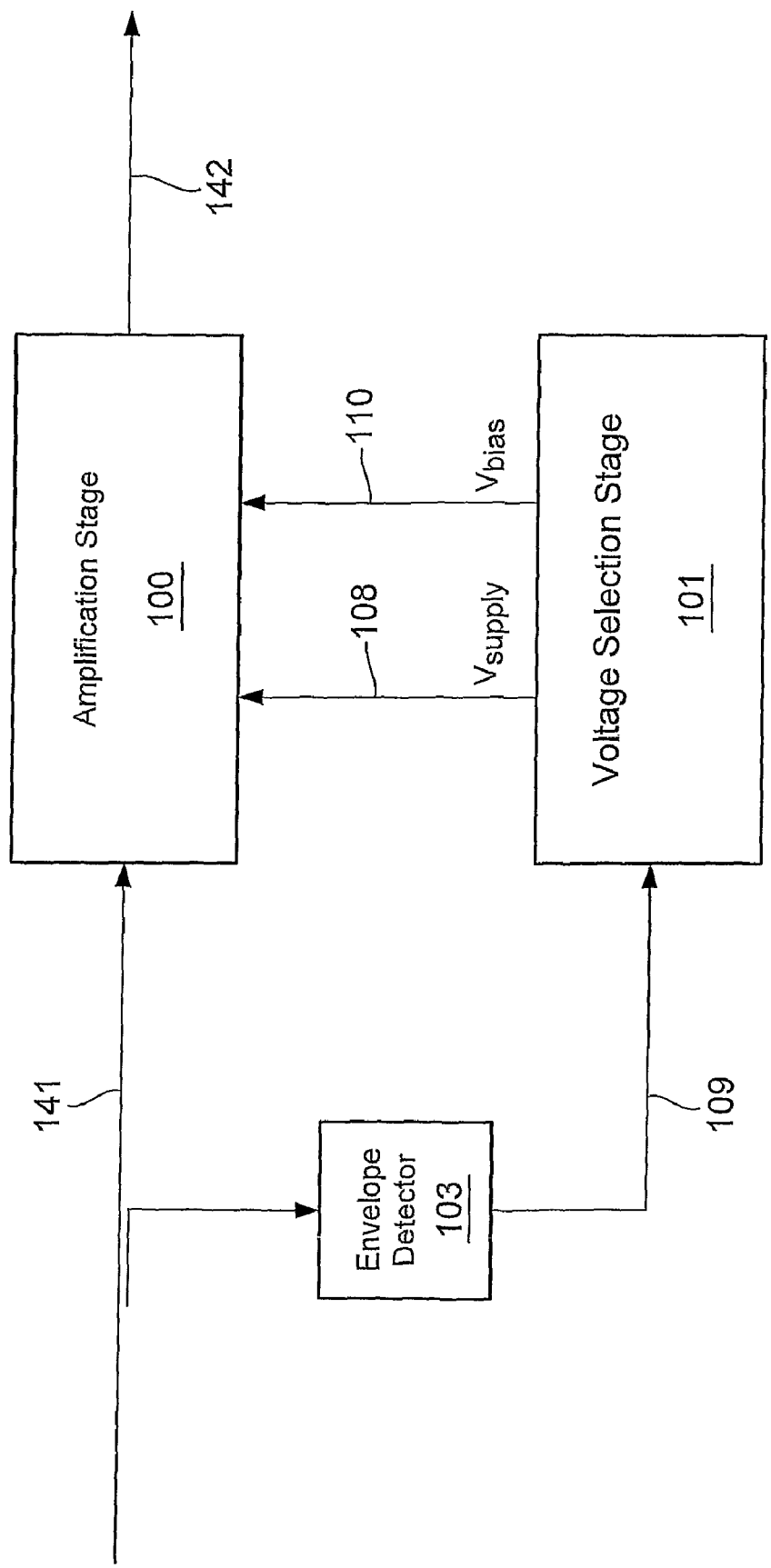
FIG. 1 is a block diagram of an arrangement for providing joint optimisation of supply and bias modulation in accordance with embodiments of the invention.

FIG. 1 is a block diagram of an amplifier system embodying the concepts of the invention. Referring to FIG. 1, there is illustrated an amplification stage 100, an envelope detector stage 103, and a voltage selection stage 101. The amplification stage receives an RF signal to be amplified at a first input port thereof on line 141, a supply voltage at a second input port thereof on line 108, and a bias voltage at a third input port thereof on line 110. The amplification stage 100 generates an amplified RF output signal at an output port on line 142.

The envelope detector 103 receives the RF signal to be amplified on line 141 at its input, and generates a signal representing the envelope of the RF input signal to be amplified at its output on line 109. The envelope signal on line 109 is then provided as an input to the voltage selection stage 101. In accordance with the principles of the present invention, as discussed in detail hereinbelow, the voltage selection stage 101 generates the supply voltage and bias voltage at outputs thereof on lines 108 and 110, for applying to the second and third input ports of the amplifier stage 100, in dependence on the envelope signal on line 109. As will be described in detail hereinbelow, the voltage selection stage supplies and modulates the supply and bias voltages for the amplification stage such that they are jointly optimised to meet prescribed linearity and efficiency goals.

The amplification stage 100 may be a single stage or multiple stage amplifier design with one or more supply voltage ports and one or more bias voltage ports, as required. In general the amplifier stage may be implemented using either one of, or a combination of, device family types (e.g. bipolar, FET, etc.) and implementation technologies (e.g. Si, GaAs, etc.). The bias voltage may be a base bias voltage for bipolar implementations and a gate bias voltage for FET implementations.

In accordance with the present invention, the voltage selection stage 101 provides the bias voltage and supply voltage to the amplifier stage 100 in dependence on the envelope of the RF signal to be amplified in a way such that the efficiency of the amplification stage 100 is improved.

By characterising the amplification stage the performance of the amplification stage for different supply voltage levels and bias voltage levels for a given input (envelope) signal level is determined. In this way it can be determined the optimum supply voltage and bias voltage levels for a given input (envelope) signal level.

In a preferred embodiment the optimum loci for bias and supply voltages to meet specific system performance goals are determined by a comprehensive characterisation of the performance of the amplification stage 100. This preferably requires multiple power sweep characterisations of the amplification stage 100 for various combinations of supply and bias voltage. The characterisation may be made using either continuous wave or modulated RF carrier(s), and may include measurement of several parameters from the following non-exhaustive list: supply voltage, bias voltage, gain, phase, current, input power, output power, adjacent channel power (ACP), error vector magnitude (EVM) and correlation coefficient ($\rho$). These parameters are dependent variables, i.e. variables which are dependent upon the amplification stage.

In general, the parameters of the device are measured which are necessary to determine a particular performance characteristic. If, for example, it is desired only to ensure that the gain of the amplification stage is optimised, then only those parameters necessary to determine gain are measured, for different input (envelope) signal, bias voltage and supply voltage combinations.

By way of example, particular details of exemplary measurements for a sample amplification stage, and the utilisation of such measurements to achieve the aims of the embodiments of the present invention, are discussed below. For the purposes of these examples it is assumed that the amplification stage comprises a single stage 1 W heterostructure field effect transistor (HFET).

The characterisation at the amplification stage 100 may be carried out in a variety of ways. The purpose of the characterisation process is to obtain measurements for the amplification stage 100 which are necessary to determine a particular performance characteristic for combinations of input (envelope) signal level, bias voltage, and supply voltage. Most conveniently the characterisation may be carried out using automated test equipment. As an example, the automated measurement of various simple parameters of the example single stage 1 W HFET amplifier may be expressed by the following pseudo-code:

```
For Vcc = 1 to 8V in 50mV                            steps
    For Vbias = 1.1 to 1.9V in 10mV                  steps
        For Pin = −5 to 21 dBm in 0.2dB              steps
            Record Vcc, Vbias, Pin, Gain, Current,   Phase
        end
    end
end
```

This 'quasi-static' characterisation clearly does not account for memory effects. Memory effects are the effects caused by a previous value of a measurement point, i.e. the effect of a transition from a previous value to a current value. However memory effects are of much less significance in low power arrangements than in high power devices, and thus in low power arrangements quasi-static characterisation is satisfactory. Where necessary, the characterisation process may be extended to account for memory effect.

Automated characterisation may also easily be extended to include other independent variables, i.e. variables independent of the amplification stage 100 itself, such as temperature and frequency. In general it can be understood that 'dependent' variables refers to those variables which are directly dependent upon the amplification stage 100 itself, whilst 'independent' variable refers to variables which are not dependent upon the device but rather are dependent on features external to it.

A measurement database for a given amplification stage may thus be established following a characterisation process. The resulting measurement database can be queried to determine key aspects of device performance. Parameters derived from the measured parameters, such as Power Added Efficiency (PAE) which is the difference between RF output and RF input power divided by DC power, may also be conveniently added to the database.

Figure 2:
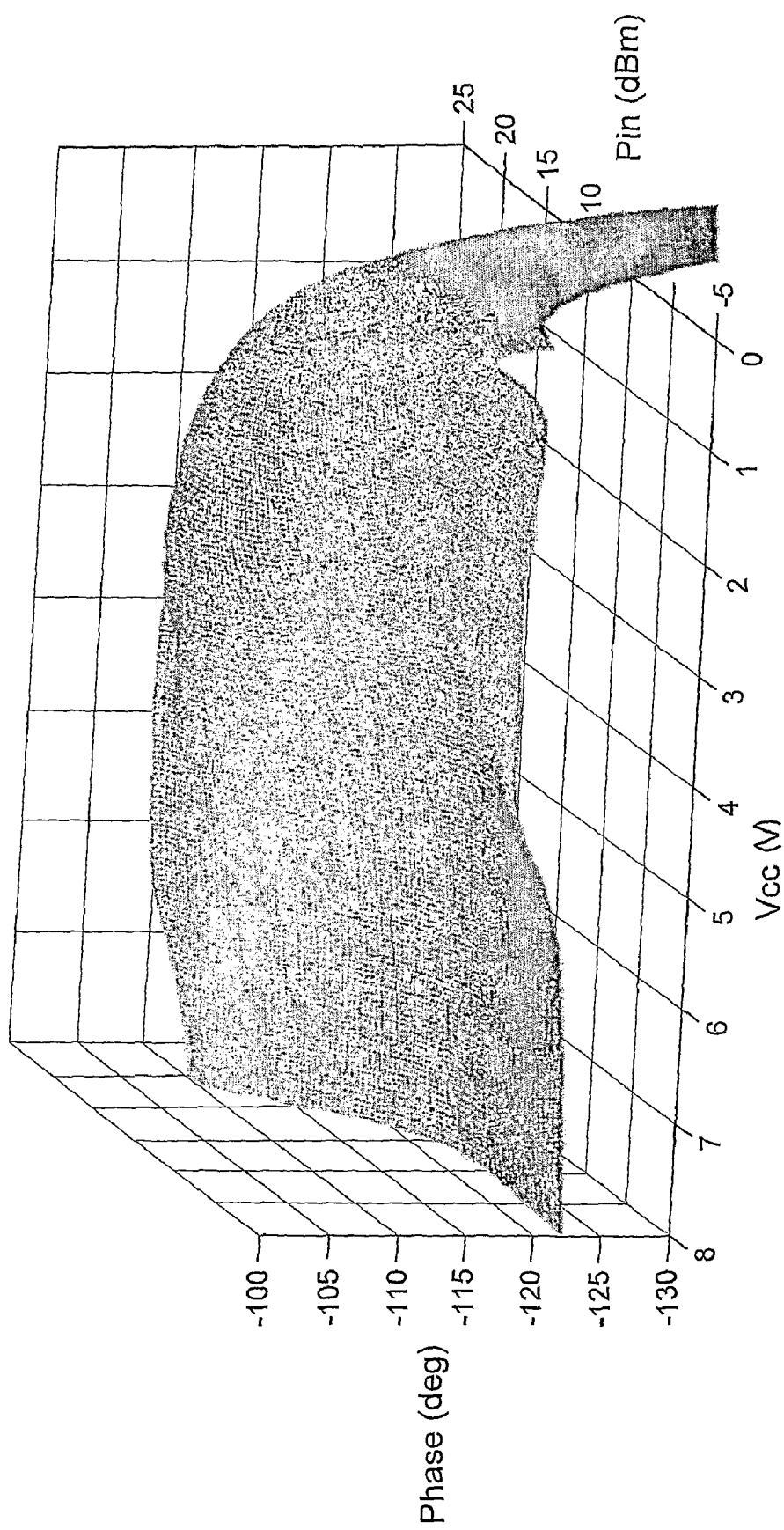
FIGS. 2 to 4 are examples of parameters measured during characterisation of an amplification stage in accordance with embodiments of the invention.
Figure 3:
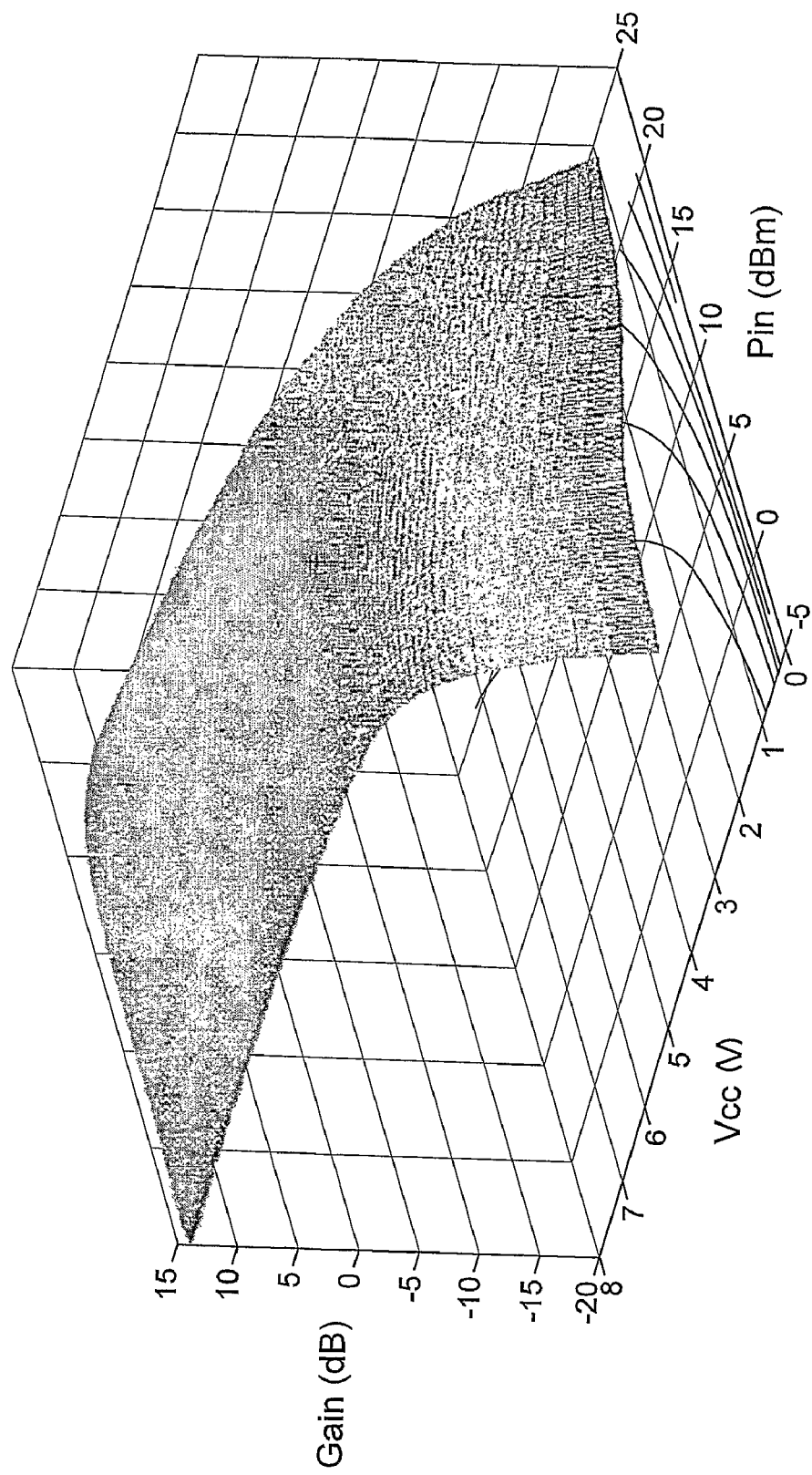
Figure 4:
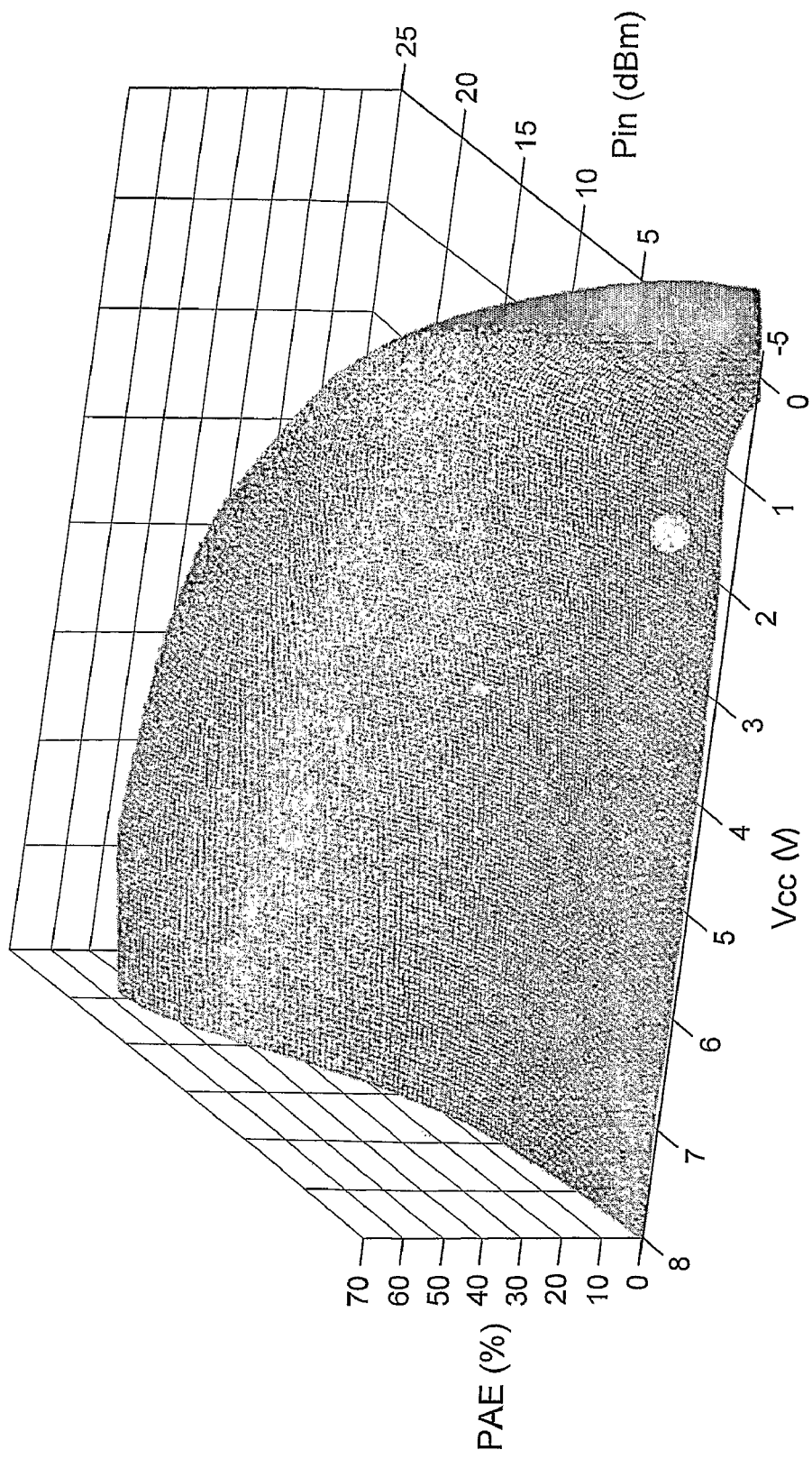

Simple non-exhaustive examples of obtained measurements for the example single stage 1 W HFET amplification stage are shown in FIGS. 2 to 4.

FIG. 2 shows a three dimensional plot for the result of an automated measurement of the amplifier phase variation with respect to input power (Pin) and supply voltage (Vcc) for one particular fixed bias voltage (1.5V).

FIG. 3 shows a three dimensional plot for the result of an automated measurement of the amplifier gain variation with respect to input power (Pin) and supply voltage (Vcc) for a particular fixed bias voltage (1.5V).

FIG. 4 shows a three dimensional plot for the result of automated measurement of the amplifier power added efficiency (PAE) variation with respect to input power (Pin) and supply voltage (Vcc) for a particular fixed bias voltage (1.5V).

Each of the three-dimensional surfaces shown in FIGS. 2 to 4 represents one of many such amplifier phase variation, amplifier gain variation and PAE surfaces respectively parameterised by bias voltage. Thus one such surface will result for each distinct bias voltage for which measurements are taken. Where the pseudo code stated above is used, measurements are taken for bias voltages between 1.1V and 1.5V in 10 mV steps.

From the example measurements obtained, as illustrated in FIGS. 2 to 4, for each discrete value of bias voltage there is obtained a sequence of results showing the variation of phase, gain and PAE with respect to supply voltage and input power (which is representative of the input envelope).

As a result of such measurements, a measurement database can be established based on all the results obtained.

Figure 5:
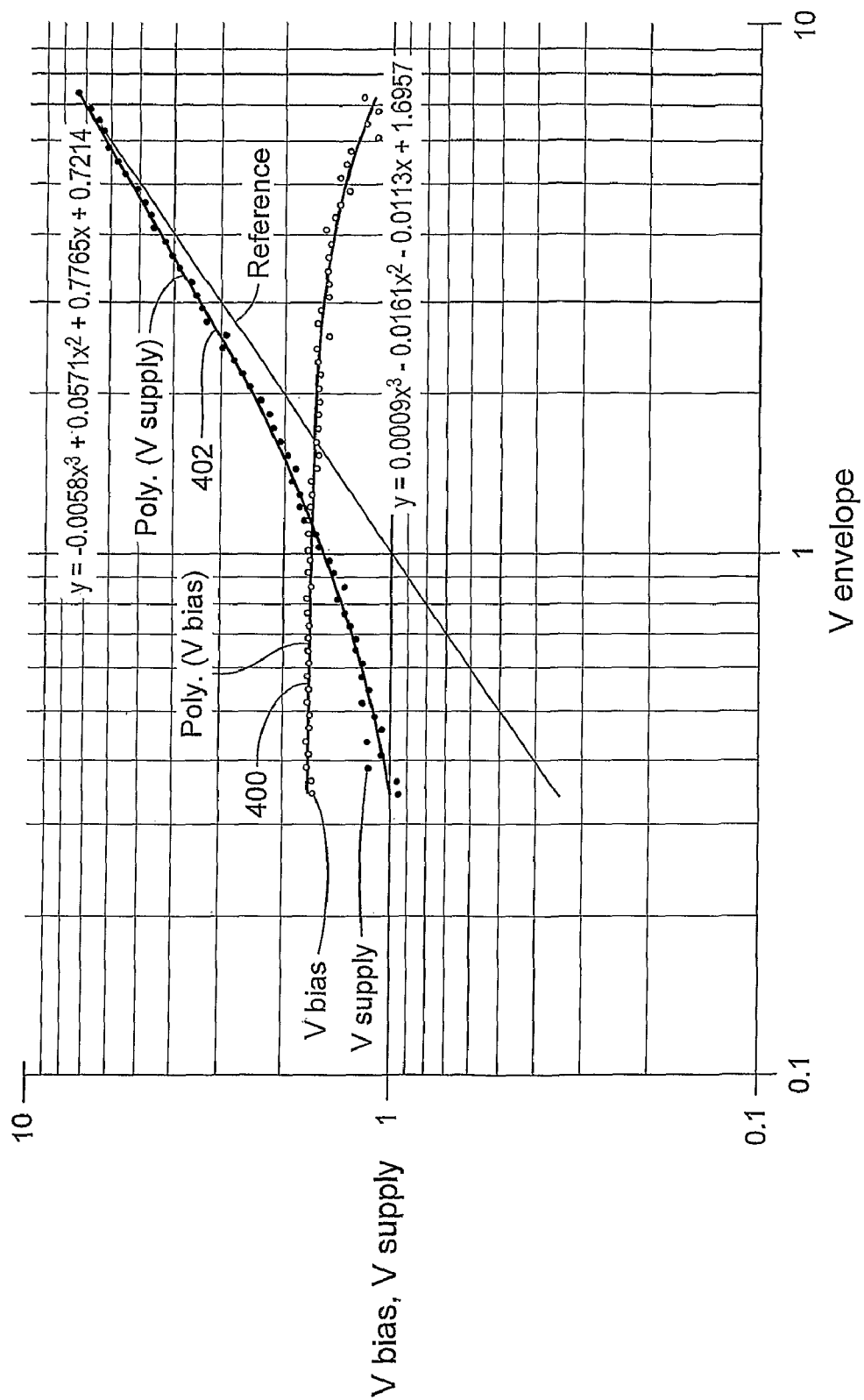
FIG. 5 is an example of output data extracted from a measurement database based on the characterisation of an amplification stage in accordance with embodiments of the invention.

FIG. 5 illustrates an example of the use of values contained in the measurements database. FIG. 5 shows the loci 402 for supply voltage and the loci 400 for bias voltage versus input envelope for an amplifier optimised to achieve maximum efficiency for a specified constant gain target. The loci are formed based on the discrete measurements which are obtained from the measurements database and plotted. In the example of FIG. 5 the target gain is set as 10 dB. Thus it can be seen from FIG. 5 that for a given instantaneous input envelope value, the supply voltage and bias voltage can both be selected to optimise maximum efficiency for a specified gain target. Thus the measurement database created from the information in FIGS. 2 to 4 may be queried to determine the combination of supply and bias voltages which maximise the amplifier efficiency for any given input power.

FIG. 6 shows a plot of the measured gain against output power performance of the example single stage 1 W HFET amplifier optimised for a) maximum PAE as illustrated by curve 304 and b) constant gain as illustrated by curve 302, compared with (c) a conventional (prior art) fixed bias amplifier as illustrated by curve 300. This is not illustrative of the use of the data from the measurements database, but rather illustrative of the performance achieved by the amplification stage in use when the supply and bias voltages are selected according to the principles of embodiments of the invention.

The measurement database may also be queried to determine the combination of supply and bias voltages which maximise the amplifier PAE for any given input power, using results obtained in the characterisation process exhibited by FIG. 4.

Curve 304 in FIG. 6 thus shows the amplifier gain associated with optimum efficiency operation. It can be seen that at low output power the gain reduces substantially. This introduces two significant problems. Firstly, the gain expansion caused by the reduced gain introduces significant distortion, and secondly the overall efficiency of a multi-stage amplifier is reduced as the contribution of driver and pre-driver stages to efficiency becomes more significant. One approach to dealing with this problem is to use pre-distortion linearization to compensate the gain of the amplifier. While this addresses the distortion problem, the efficiency problem remains and may be further compounded by the additional power consumption of a linearizer.

Another approach to addressing this gain expansion problem is to formulate a measurement database query to determine the combination of supply and bias voltages which result in a particular target gain. There are a large number of combinations of supply and bias voltage which fulfil this criterion; so for example it may be further stipulated that the combination of interest is that which achieves maximum PAE. Such an example loci is shown in FIG. 5. This then uniquely identifies the loci of supply and bias voltages with respect to input power.

There are many queries which could be constructed to achieve various system objectives. For example, a query could be constructed which determined the supply and bias voltage loci required to achieve max PAE for constant phase.

The queries may be constructed using many software tools, such as Matlab. An implementation using SQL (Structured Query Language) for the example HFET amplifier is now described below by way of example. This example relates to a specific example query.

First, a query is constructed to create a table of measurements which result in 10 dB+/− 0.5 dB amplifier gain. This query may be structured as follows:

```
SELECT
    [Measdata].Pband,
    [Measdata].Pin,
    [Measdata].Vcc,
    [Measdata].Vbias,
    [Measdata].PAE,
    [Measdata].Gain,
    [Measdata].Phase
INTO
    [10dBgain]
FROM
    [Measdata]
WHERE
    Round([Measdata].Gain,0) = 10
ORDER BY
    [Measdata].Pband;
```

Next, the measurement which results in max PAE for each output power level is isolated:

```
SELECT
    [10dBgain].Pband,
    [10dBgain].Pin,
    [10dBgain].Vcc,
    [10dBgain].Vbias,
    [10dBgain].PAE,
    [10dBgain].Gain,
    [10dBgain].Phase,
    [10dBgain].ID
INTO
    [constgainlocus]
FROM
    [10dBgain]
WHERE
```

-continued

```
        ((([10dBgain].Pband & " " & [10dBgain].PAE)
    IN
    (SELECT
        [10dBgain].Pband & " " & Max([10dBgain].PAE)
    FROM
        [10dBgain]
    GROUP BY
        [10dBgain].Pband)))
    ORDER BY
        [10dBgain].Pband;
```

This query, in effect, picks the best linearity, and then picks the best efficiency. Linearity may be spectral linearity, constant gain (or low variation gain that meets linearity constraints), constant phase (or low variation phase that meets linearity constraints), or a combination of any of these.

Referring now once again to FIG. 5, which shows the resulting supply locus 402 and bias voltage locus 400 plotted against the envelope of the input voltage, it can be seen that the required loci may be approximated well by a $3^{rd}$ order polynomial.

FIG. 7 shows the measured efficiency versus output power performance of a controlled dual bias amplifier optimized for a) maximum PAE as illustrated by curve 200 and b) constant gain as illustrated by curve 202 compared with (c) a conventional (prior art) fixed bias amplifier as illustrated by curve 204. FIG. 7 also shows the power probability density (pdf) function of an OFDM signal such as WiMax as illustrated by curve 206. The average efficiency over the full pdf can be computed from this information. Curve 200 in FIG. 7 is a plot of optimum PAE versus output power for the example single stage 1 W HFET amplifier.

Curve 202 of FIG. 7 shows the resulting PAE achieved for dual bias for optimised gain. At high powers, the PAE is very close to the optimum PAE. At low powers it is somewhat less than the optimum, but still considerably greater than the PAE of a conventional (prior art) fixed bias amplifier as represented by curve 204. The corresponding gain curve for the dual bias amplifier is shown by curve 302 of FIG. 6.

Figures 8, 9:
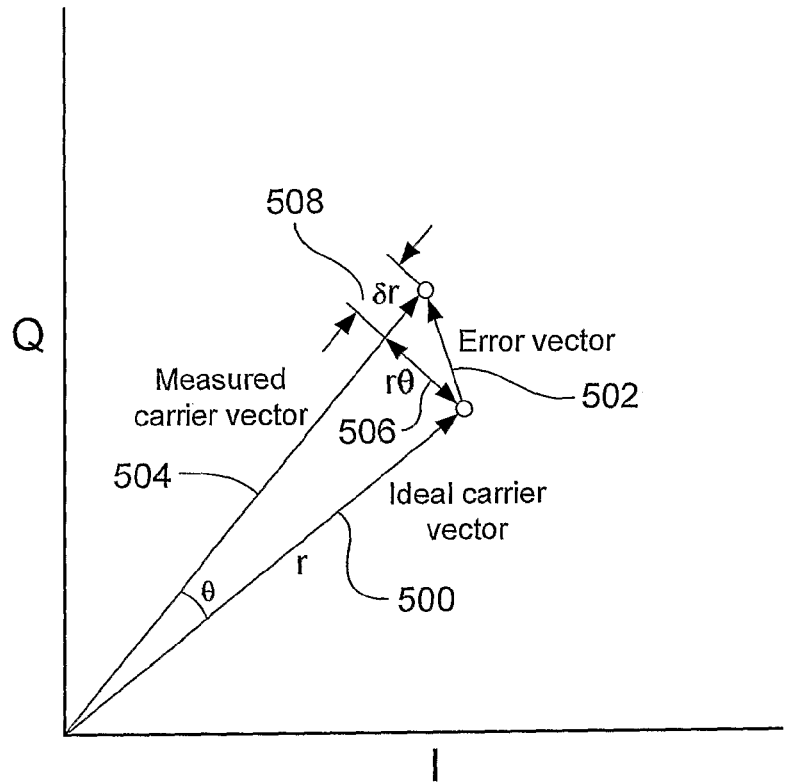
FIG. 8 illustrates a definition of instantaneous error vector magnitude.
FIG. 9 summarises in tabular form the results of FIG. 7.

In another alternative example a query may be used in order for the supply and bias voltage loci for minimum ACPR to be determined. ACPR is directly proportional to the magnitude of the instantaneous error between ideal and actual waveforms. Hence, in the absence of memory effect ACPR can be minimised by minimising the instantaneous EVM. FIG. 8 illustrates, graphically, the definition of instantaneous Error Vector Magnitude. Referring to FIG. 8, the instantaneous EVM is the magnitude of the Error Vector 502 and is the difference between the Ideal Carrier Vector 500 and the measured Carrier Vector 504. It is clear from FIG. 8 that the magnitude of the error vector 502 may be directly calculated from the instantaneous magnitude error $\delta r$ 508 and phase error $r\theta$ 506.

It should be noted that the instantaneous EVM is different from the 'system' EVM often quoted as a waveform quality metric for wireless standards. The system EVM is a measure of the carrier error vector at particular sampling instants (corresponding to the constellation points) and is usually measured after an ideal matched receive filter. A consequence of the 'memory' introduced by the filter is that there is not a one-to-one correspondence between the instantaneous power and system EVM.

Returning to the dual bias single stage 1 W HFET amplifier example, it is useful to be able to predict the average efficiency of an amplifier when operated with a high peak to average power ratio (PAP) signal. For example the power statistics of an orthogonal frequency division multiplexing (OFDM) signal such as that used in the 802.16 (WiMax) or the 802.11a (WLAN) standard may be approximated by a Rayleigh distribution as shown in curve 206 of FIG. 7. Using signal power probability density statistics and the measured instantaneous amplifier PAE, the weighted average efficiency of the dual bias amplifier for any modulation scheme may be computed as a function of average power.

FIG. 9 shows in table form the average efficiency of the example controlled single stage 1 W HFET dual bias amplifier optimised for a) maximum PAE and b) constant gain compared with a traditional fixed bias amplifier for various average amplifier output powers. The table in FIG. 9 compares the predicted average efficiency of a conventional (prior art) fixed bias amplifier carrying a 802.11a 64QAM OFDM signal with that of two dual bias amplifier variants: one optimised for best efficiency and the other for constant gain. Note that these results are indicative of the efficiency of the RF amplifier alone, and do not account for the efficiency of the supply modulator or of any ancillary circuits. The table of FIG. 9 summarises the curves of FIG. 7.

Figure 10:
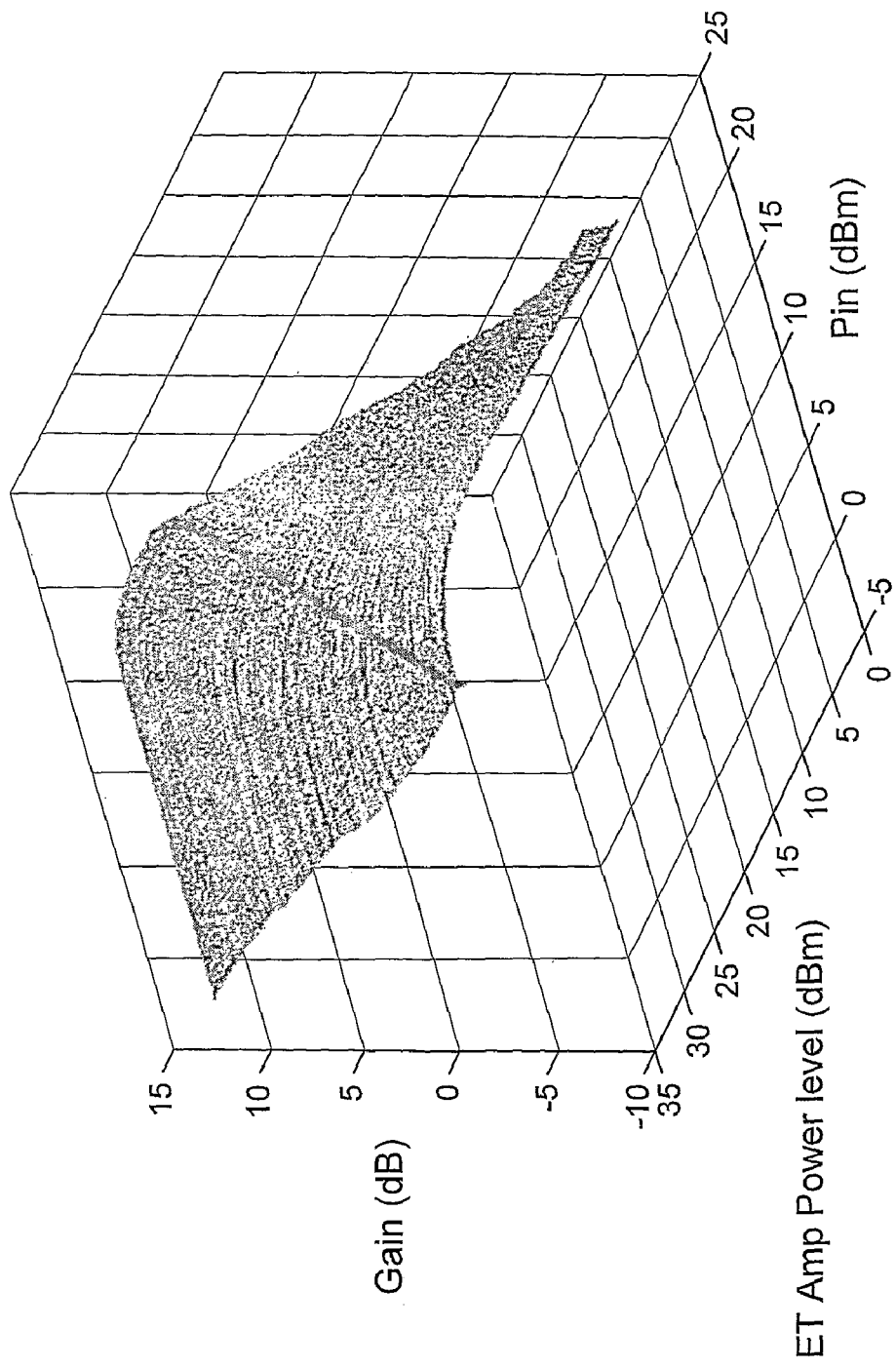
FIGS. 10 and 11 illustrate measured compression characteristics of an amplification stage adapted to operate in accordance with embodiments of the invention.
Figure 11:
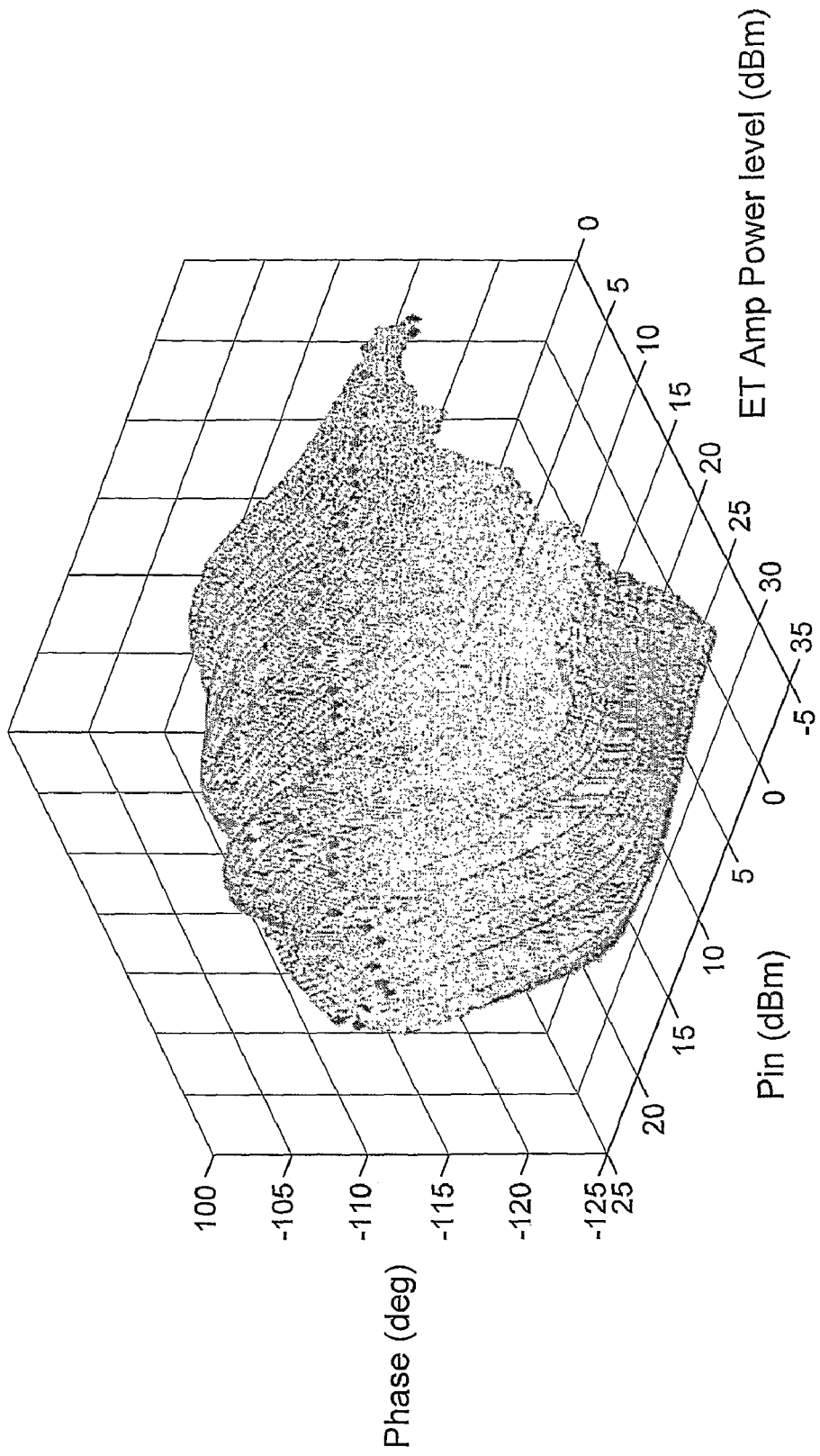

FIG. 10 shows the AM-AM compression characteristics of the example controlled dual bias single stage 1 W HFET amplifier optimized to achieve maximum efficiency for a constant 10 dB gain target. FIG. 11 shows the AM-PM compression characteristics of the example controlled dual bias single stage 1 W HFET amplifier optimised to achieve maximum efficiency for a constant 10 dB gain target. The plots of FIGS. 10 and 11 show the measured variation of phase with input power whilst supply and bias voltages are fixed at their optimum values for each output power level.

FIG. 10 and FIG. 11 give an indication of the sensitivity of a dual bias amplifier optimised for constant gain to mistracking between the input power and the 'target' supply and bias voltages. The 'noise' in the AM-PM curves shown in FIG. 11 is believed to be an artefact of the measurement system rather than a characteristic of the device. For any output power in FIG. 10 or FIG. 11, the supply and bias voltages are set to their predicted ideal values. The highlighted points on the surfaces show the expected gain and phase when the amplifier input power is exactly correct. The curves then show the expected gain and phase variation if the voltages are held at their calculated values, and the input power is varied. Hence these Figures show the sensitivity to errors in the input power, or conversely errors in the supply and bias 'set' voltages. It can be seen that the sensitivity to mistracking is greater at high output powers than low output powers. This result is intuitively expected, as the amplifier compression is greater at high output power.

Figure 12:
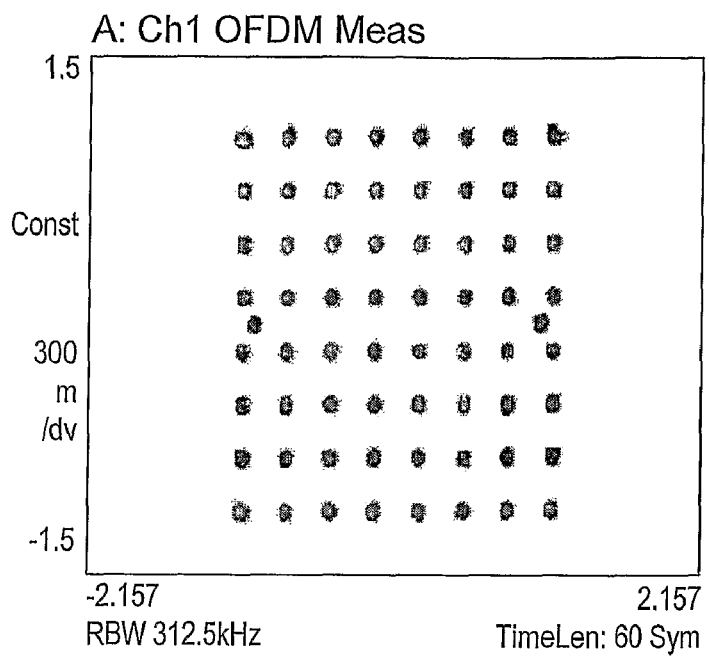
FIGS. 12 and 13 show predicted constellation and predicted spectrum respectively of an amplification stage modified to operate in accordance with an embodiment of the invention.
Figure 14:
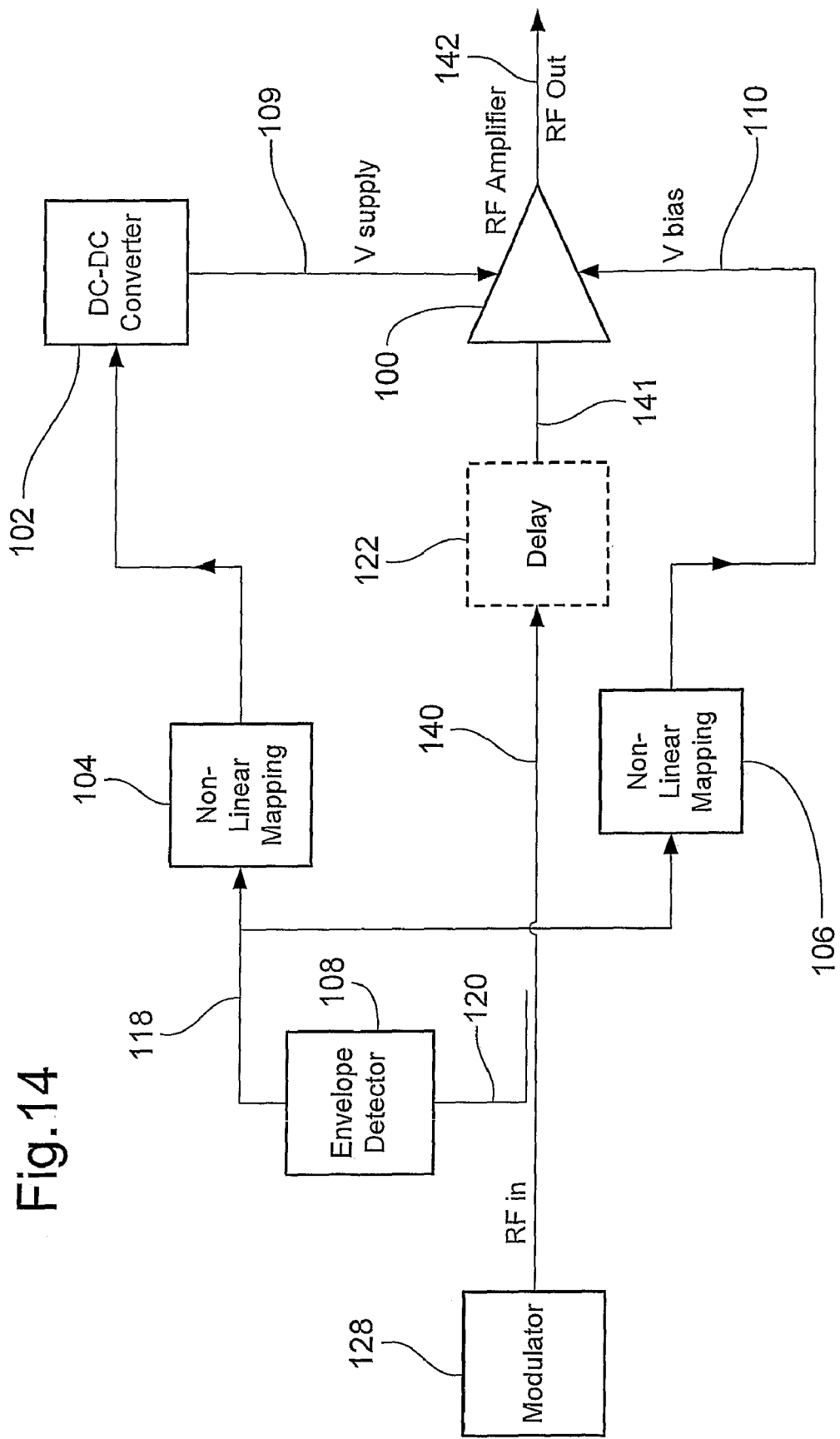
FIGS. 14 to 16 show exemplary implementations in accordance with embodiments of the invention.

FIG. 12 shows the predicted constellation of a constant gain optimised dual bias amplifier, and FIG. 14 shows the predicted spectrum of a constant gain optimised dual bias amplifier, both carrying a 64QAM OFDM signal at 10 dB back-off. FIG. 11 and FIG. 12 are indicative of the performance expected with a WiMax signal, which has a similar modulation format. It can be seen that the stringent EVM performance required for a high order OFDM signal should in principle be attainable using a 'self linearised' dual bias amplifier.

In the above description, there has been described an example way in which the device may be characterised, and the data resulting from such characterisation stored in a database which may then be accessed to obtain preferred or optimum operational characteristics to meet specific or predefined system performance objectives. The characterisation of the device in this way and the use of a database in this way is only one example of achieving the benefits of the present invention. In an alternative a model may be used.

The use of a model rather than a database provides estimates in place of having to search a large database. Updating a model in real-time is less onerous than updating a database. A model can be tapped into in the same way that a database can. The model may be created using measurements. The inputs to the model may be from the group comprising bias voltage; supply voltage; input power; input phase; temperature; device periphery; and load impedance. The outputs from the model may be from the group comprising: output power; output phase; gain; supply current; adjacent channel power; error vector magnitude; correlation coefficient.

With reference to FIGS. 2 to 13 it has been described above how an exemplary device may be characterised, and how the measurements obtained by such characterisation may be used for joint optimisation of supply and bias voltages for prescribed goals. It is further described the performance gains that can be thereby obtained. The practical implementation of such a technique is now described by way of reference to particular non-limiting embodiments.

An arrangement in accordance with a first embodiment of the invention is now described with reference to FIG. 14. Elements of this Figure which correspond to elements shown in FIG. 1 are identified by like reference numerals. FIG. 14 illustrates an embodiment in which the invention is implemented in the analogue domain.

In the embodiments of FIG. 14, and subsequent embodiments described herein, there is shown an amplification stage 100 comprising a single RF amplifier. It should be understood, as discussed hereinabove, that the invention is not limited to any specific amplifier arrangement.

In the arrangement of FIG. 14 the amplifier 100 receives an RF input signal at a first input port on line 141, a continuously variable amplifier supply voltage on a line 108 at a second input port, and an amplifier bias voltage on line 110 at a third input port. The amplifier generates an RF output signal on line 142 at an output port.

The RF amplifier is fed with a non-constant envelope signal (e.g. OFDM, CDMA) as an RF input signal on line 141, to which no pre-distortion has been applied. The RF input signal on line 141 is provided as an input to the amplifier 100 via an optional delay stage 122. As known in the art, the delay stage 122 is optionally provided to delay the input signal to be applied to the amplifier 100 to allow for processing taking place on signals derived from such input signal and which also form the basis of further inputs to the amplifier. The RF input signal is generated by a modulator 128, provided on line 140 to delay stage 122.

The continuously variable amplifier supply voltage on line 109 is supplied by a switched mode DC-DC converter 102. The DC-DC converter 102 is controlled by an output from a non-linear mapping entity 104. The amplifier bias voltage on line 110 is provided by the Output of a non-linear mapping element 106.

Each of the non-linear mapping entities 104 and 106 receives as an input a signal representing the envelope of the RF signal to be amplified. This signal is generated on a line 118 at the output of an envelope detector 108, which receives as an input the RF signal to be amplified on line 120.

The relationship between the instantaneous envelope of the RF input 118 and the supply voltage 109 is defined by analogue non-linear mapping element 104. Similarly, analogue non-linear mapping element 106 is used to define the relationship between the RF envelope 118 and the amplifier bias voltage 110. In general, the mapping functions of elements 104 and 106 are likely to be different from one another, although this is not essential.

An arbitrary non-linear function may be used to describe the non-linear mapping required in blocks 104 and 106. Typically, the required mappings may be adequately described by a polynomial expansion of order 3. This is discussed hereinabove in relation to FIG. 5. The non-linear functions may be 'pre-set' at manufacture. This is discussed in further detail hereinbelow.

Thus the analogue non-linear mapping functions are arranged to provide an appropriate functionality such that in response to a current detected level of the envelope signal at the respective inputs, a preferable or optimum bias or supply voltage is generated at the output. This non-linear mapping functionality may be achieved by an appropriately arranged analogue circuit.

Figure 13:
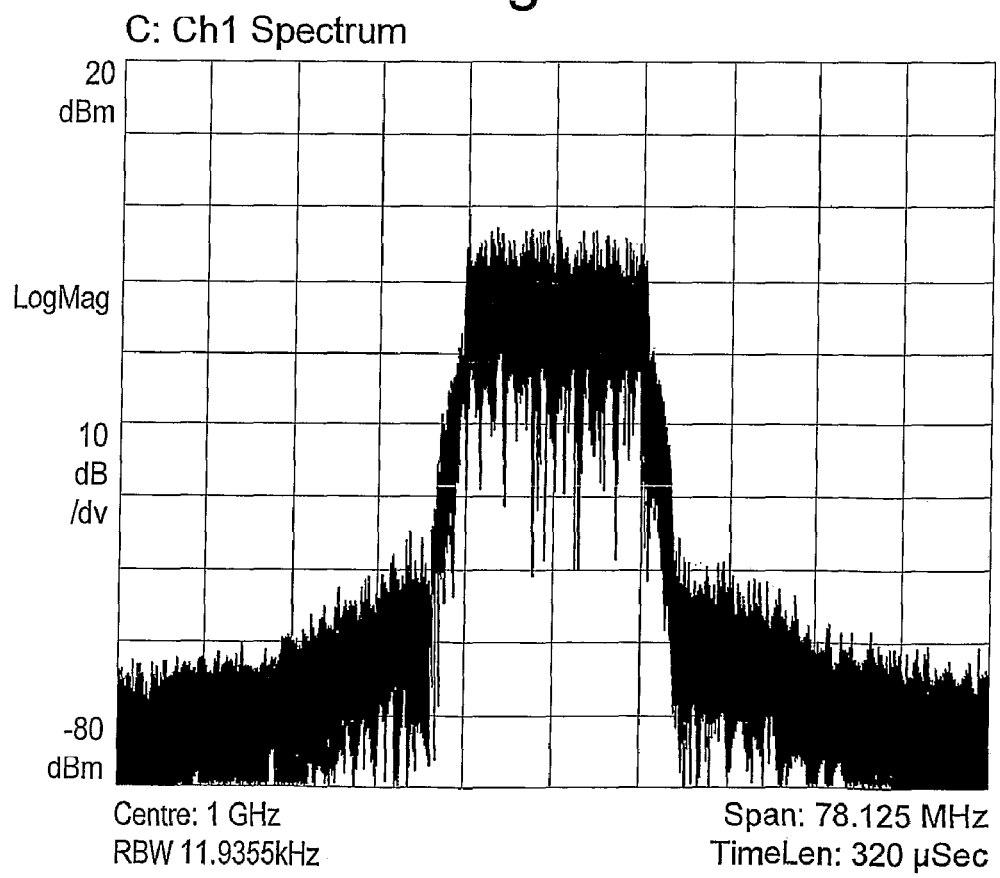
Figure 15:
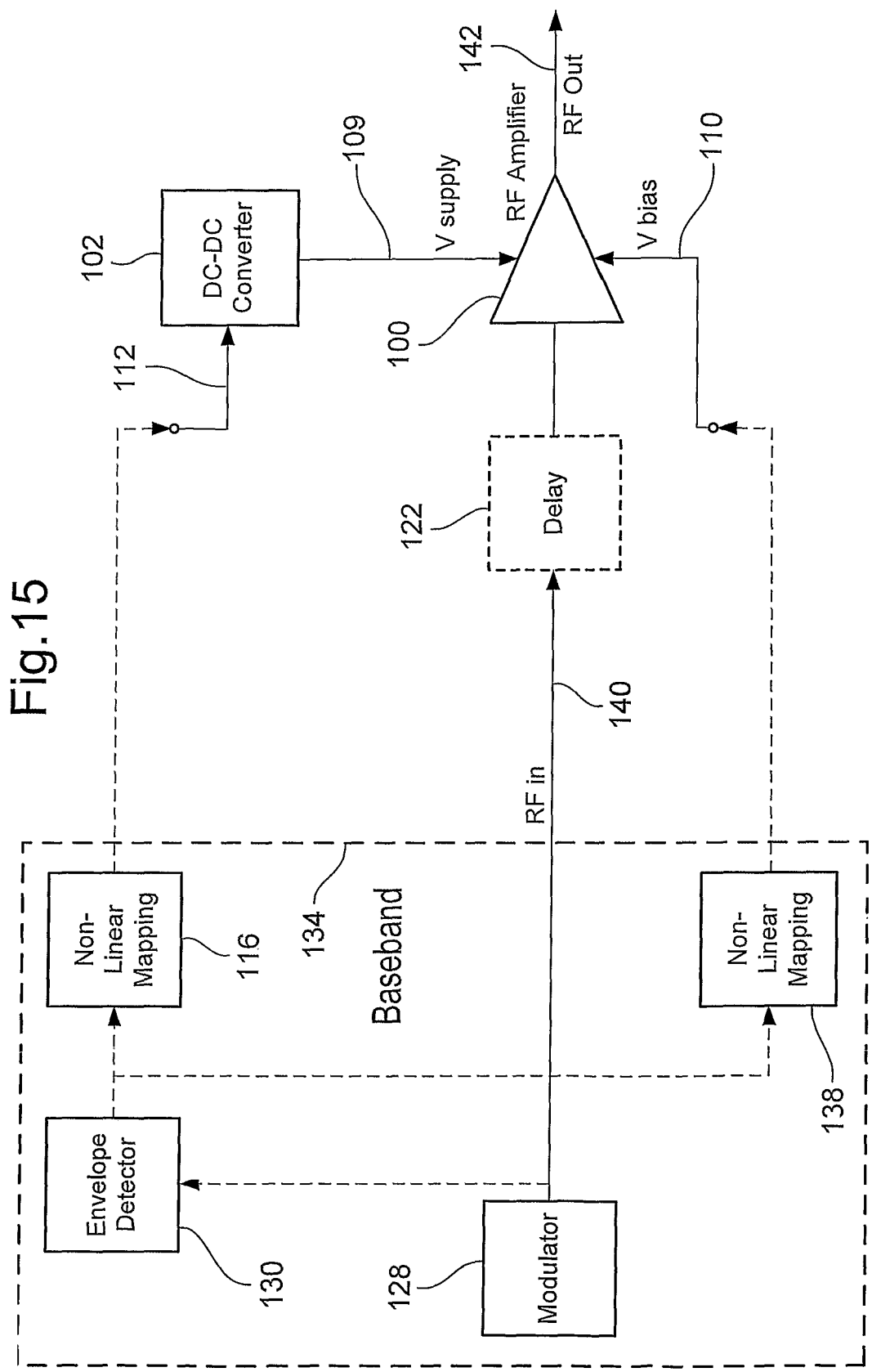

An arrangement in accordance with a second embodiment of the invention is now described with reference to FIG. 15. Elements of this Figure which correspond to elements shown in FIGS. 1 and 13 are identified by like reference numerals. FIG. 15 illustrates an embodiment in which the invention is illustrated in the digital domain.

In this embodiment, envelope detection is performed in the digital domain. Similarly, the non-linear mappings for supply and bias voltages are also carried out in the digital baseband. One advantage of this embodiment is the ease of implementing delay elements in the digital domain, which males it easier to obtain precise time alignment between the RF envelope input signal and the amplifier supply and bias voltages.

The amplifier supply voltage on line 109 provided by the output of the DC-DC converter 102 on line 109. The DC-DC converter 102 is controlled by an output on line 112 from a non-linear mapping entity 116. The amplifier bias voltage on line 110 is provided by the output of a nonlinear mapping element 138.

Each of the non-linear mapping entities 116 and 138 receive as an input a signal representing the envelope of the RF signal to be amplified. This signal is generated on a line at the output of an envelope detector 130, which receives as an input the RF signal to be amplified. In FIG. 15 a modulator 128 is shown which generates the RF signal to be amplified.

The relationship between the instantaneous envelope of the RF input and the supply voltage 109 is defined by digital non-linear mapping element 116. Similarly, digital non-linear mapping element 138 is used to define the relationship between the RF envelope and the amplifier bias voltage 110. In general, the mapping functions of elements 116 and 138 are different from one another.

The implementation of the non-linear mapping elements 116 and 138 may be in a variety of digital formats. For example they may comprise look-up tables storing the measurement database obtained from characterisation of the device.

In general, whether implemented in the analogue or digital domain, the mapping means approximate an ideal supply or bias mapping based on the input signal, based on the known ideal values from the characterisation of the device. Such mappings are chosen to optimise a specific system performance parameter, and the ideal values for a given input signal level may differ according to the system performance criteria to be met.

Figure 16:
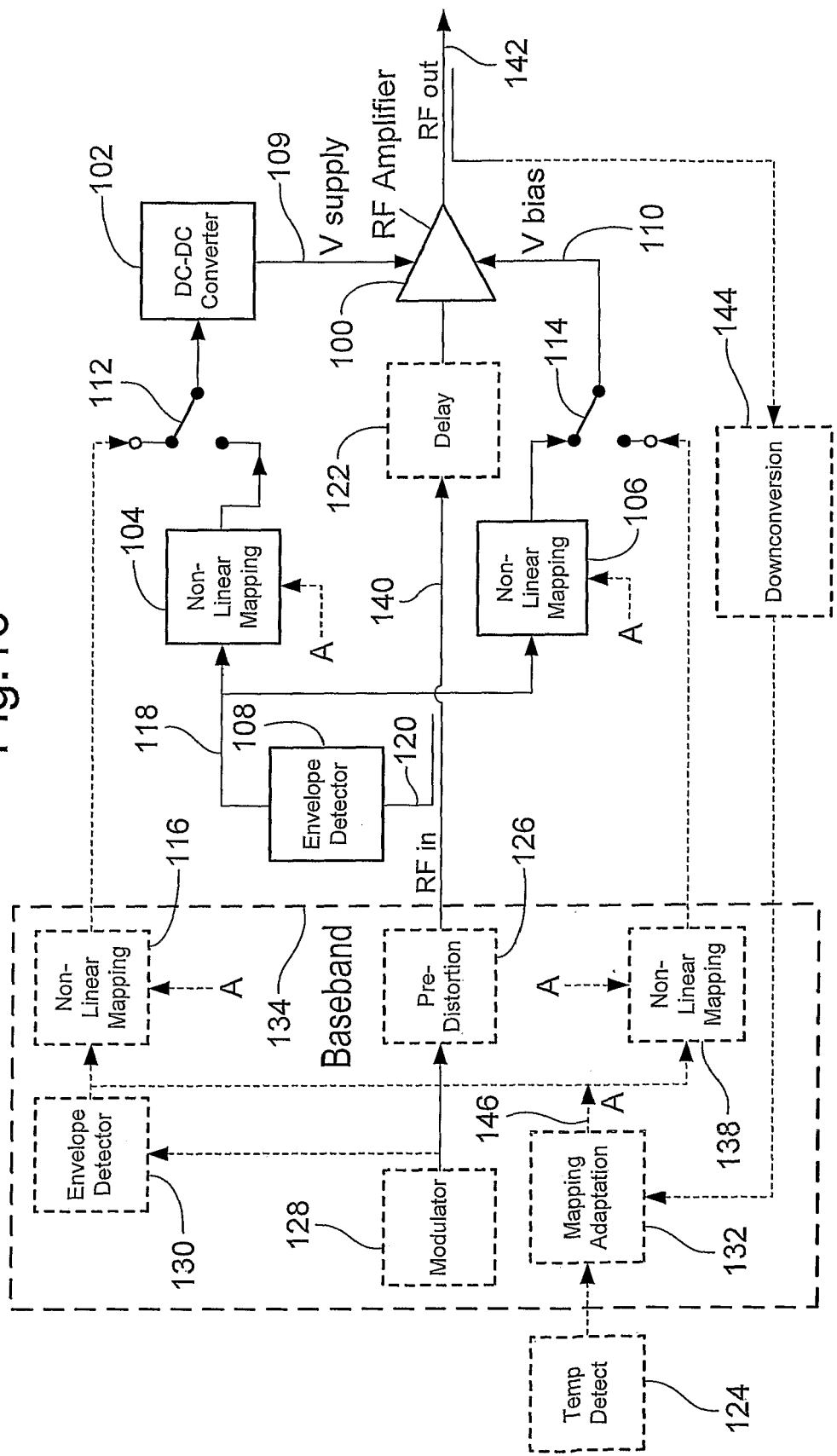

In practice, the implementation of any embodiment in accordance with the invention will be in either the analogue domain as illustrated by the example of FIG. 14, or the digital domain as illustrated by the example of FIG. 15. However in a third embodiment, as illustrated by FIG. 16, the analogue and digital arrangements may be provided in parallel. Elements of this Figure which correspond to elements shown in any previous Figure are identified by like reference numerals. FIG. 16 illustrates an arrangement in which the invention is implemented in either the analogue or digital domain.

For the purpose of illustration in FIG. 16 a switch 112 is shown which selects between the Output of the non-linear digital mapping element 116 or the output of the non-linear analogue mapping element 104, and provides the selected output to the DC-DC converter 102. Similarly a switch 114 is provided which selects either the output of the non-linear digital mapping element 138 or the output of the non-linear analogue mapping element 106 and provides the selected one as the bias voltage on line 110.

In a practical implementation such switches 112 and 114 will not be provided, and one or other of either an analogue or a digital implementation will be provided only. Switches 112 and 114 are shown in FIG. 16 merely to distinguish between the different topologies required for digital and analogue implementations, and to provide a basis for illustrating additional optional aspects of the invention in the context of both a digital and analogue environment. These additional optional aspects are now further described with further reference to FIG. 16.

The embodiments described with reference to FIGS. 13 and 14 are 'open loop' arrangements, and assume that the performance of the amplifier is time invariant. It will be appreciated that it is impractical to carry out an in depth characterisation of production amplifiers and that there will be small differences in characteristics between individual amplifiers. For applications requiring very high modulation accuracy, the architecture may be enhanced through incorporation of an adaptive digital pre-distortion (DPD) block 126 as shown in FIG. 16. The pre-distortion block is shown connected between the output of the modulator 128 and the input to the delay block 122.

The non-linear functions provided by any of the non-linear mapping elements 116, 138, 104, 106 may be 'pre-set' at manufacture as mentioned hereinabove. In an enhanced arrangement they may be updated periodically during operation. Such an enhanced arrangement is also illustrated in FIG. 16.

As further, illustrated in FIG. 16, a mapping adaptation element 132 is introduced. The mapping adaptation element 132 receives an output of a down conversion element 144, the input to which is provided by a feedback connection from the RF output of the RF amplifier 100 on line 142. The mapping adaptation element 132 thus receives feedback as to the RF output signal generated by the amplification stage. In an enhanced arrangement, the mapping adaptation element 132 is used to compute new coefficients for the non-linear mapping blocks 104, 106, 116, 138. As illustrated in FIG. 16 the mapping adaptation element 132 provides outputs on a signal line 146 which is labelled "A", The signals on line 146 are provided as inputs to each of the non-linear mapping elements 116, 138, 104, 106, to provide updated coefficients therefore. The adaptation provided by the mapping adaptation element 132 may advantageously be provided, in embodiments, for a number of reasons. The adaptation may allow for tracking of thermal effects; changes in amplified device periphery; change of operational frequency; or simply alteration of system 'targets' (e.g. to achieve minimum EVM rather than minimum ACPR). The provision of feedback information via the down conversion element 144 is not essential to the operation of the mapping adaptation element 132. The mapping adaptation element 132 may simply provide the necessary data in order to achieve new system targets. The provision of the feedback information from the output of the RF amplifier is advantageous insofar as it allows for dynamic adaptation of coefficients, to take into account effects on the operation of the amplifier stage when in use.

The mapping adaptation block 132 may further receive inputs from a temperature detector 124 to assist in the mapping adaptation process. In practice, the down-conversion block may be the receiver chain of a transceiver rather than a dedicated block. Typically, a serial digital bus 146 is used to communicate updated coefficients to the non-linear mapping blocks 104, 106, 116, 138.

The amplification stage may further incorporate supply voltage modulation means comprising: a plurality of DC supply voltages and means for selecting one DC supply voltage dependent on the output of said non-linear supply mapping means; means for determining the error between said selected DC supply voltage and the output of said non-linear supply mapping means; and summing means for adding correction voltage to said selected DC supply voltage, wherein the amplifier supply voltage is substantially a replica of the output of said non-linear supply mapping means.

The present invention has been described herein by way of reference to particular exemplary arrangements and embodiments, which arrangements and embodiments do not limit the scope of the invention. The scope of protection afforded by the invention is defined by the appended dependent claims. One skilled in the art will appreciate variations in respect of the embodiments of the invention presented herein which fall within the scope of the appended claims.

The following claims are presented for examination:

1. A method of controlling an amplification stage, comprising:
   a. selecting a linearity objective for the amplification stage;
   b. measuring at least one amplifier dependent characteristic in dependence on at least one amplifier independent characteristic;
   c. determining a preferred combination of bias and supply inputs to achieve the linearity objective based on said measurements;
   d. creating a searchable database of said amplifier dependent and independent characteristics;
   e. searching said database to simultaneously determine the optimum combination of bias and supply voltage at each input power over the measurement range to achieve the linearity objective;
   f. in dependence on an input signal to said amplification stage, determining a combination of supply input and bias input for the amplification stage in order to meet said linearity objective;
   g. in dependence on there being more than one combination of supply input and bias input for meeting the linearity objective, selecting the combination that optimises efficiency for the amplification stage; and
   h. applying the supply voltage and the bias voltage based on said determined combinations.

2. The method according to claim 1 wherein the supply input and bias input vary in dependence on a variation in the input signal.

3. The method according to claim 1 wherein the supply input and the bias input vary in dependence on a variation in the envelope of the input signal or the power of the input signal.

4. The method according to claim 3 wherein the step of determining a preferred combination is based on an instantaneous value of the input signal.

5. The method according to claim 1 further comprising the step of measuring a plurality of amplifier dependent characteristics in dependence on a plurality of amplifier independent characteristic.

6. A method of controlling an amplification stage comprising:
   a. selecting an linearity objective for the amplification stage;
   b. measuring a plurality of amplifier dependent characteristics in dependence on a plurality of amplifier independent characteristics;
   c. creating a model of the amplifier operating for emulation of said measured amplifier characteristics; and
   d. determining from said model the optimum combination of bias and supply voltage at each input power over the measurement range to achieve specific system performance objectives;
   e. in dependence on an input signal to said amplification stage, determining a combination of supply input and bias input for the amplification stage in order to meet said linearity objective;
   f. in dependence on there being more than one combination of supply input and bias input for meeting the linearity objective, selecting the combination that optimises efficiency for the amplification stage; and
   g. applying the supply voltage and the bias voltage based on said determined combinations.

7. The method according to claim 6 wherein said model is in real-time or non-real-time.

8. The method according to claim 6 further comprising simultaneously applying a modulated RF waveform and the determined optimum combination of bias and supply voltage to said amplifier.

9. A method of controlling an amplification stage comprising:
   a. selecting a linearity objective for the amplification;
   b. measuring at least one amplifier dependent characteristic in dependence on at least one amplifier independent characteristics, wherein the plurality of amplifier independent characteristics are from the group comprising bias voltage; supply voltage; input power; input phase; temperature; device periphery; and load impedance;
   c. determining a preferred combination of bias and supply inputs to achieve the specific linearity objective based on said measurements;
   d. in dependence on an input signal to said amplification stage, determining a combination of supply input and bias input for the amplification stage in order to meet said linearity objective; and
   e. in dependence on there being more than one combination of supply input and bias input for meeting the linearity objective, selecting the combination that optimises efficiency for the amplification stage.

10. A method of controlling an amplification stage comprising:
   a. selecting a linearity objective for the amplification;
   b. measuring at least one amplifier dependent characteristic in dependence on at least one amplifier independent characteristics, wherein the plurality of amplifier dependent characteristics are from the group comprising: output power; output phase; gain; supply current; adjacent channel power; error vector magnitude; and correlation coefficient;
   c. determining a preferred combination of bias and supply inputs to achieve the specific linearity objective based on said measurements;
   d. in dependence on an input signal to said amplification stage, determining a combination of supply input and bias input for the amplification stage in order to meet said linearity objective; and
   e. in dependence on there being more than one combination of supply input and bias input for meeting the linearity objective, selecting the combination that optimises efficiency for the amplification stage.

11. The method according to claim 6 wherein the inputs to the model are from the group comprising bias voltage; supply voltage; input power; input phase; temperature; device periphery; and load impedance.

12. The method according to claim 6 wherein the outputs from the model are from the group comprising: output power; output phase; gain; supply current; adjacent channel power; error vector magnitude; and correlation coefficient.

13. The method according to claim 1 wherein said system performance objectives comprise highest power added efficiency; highest drain efficiency; constant gain; constant phase; lowest adjacent channel power; lowest error vector magnitude; and highest correlation coefficient.

14. The method according to claim 1 wherein the supply and bias inputs are selected in dependence upon one or more previous input signal values.

* * * * *